United States Patent
Lakshmanan et al.

(10) Patent No.: US 7,149,989 B2
(45) Date of Patent: Dec. 12, 2006

(54) METHOD OF EARLY PHYSICAL DESIGN VALIDATION AND IDENTIFICATION OF TEXTED METAL SHORT CIRCUITS IN AN INTEGRATED CIRCUIT DESIGN

(75) Inventors: Viswanathan Lakshmanan, Thorton, CO (US); Alan Holesovsky, Loveland, CO (US); Lisa M. Miller, Ft. Collins, CO (US); Jonathan P. Kuppinger, Windsor, CO (US)

(73) Assignee: LSI Logic Corporation, Milpitas, CA (US)

( * ) Notice: Subject to any disclaimer, the term of this patent is extended or adjusted under 35 U.S.C. 154(b) by 203 days.

(21) Appl. No.: 10/947,498

(22) Filed: Sep. 22, 2004

(65) Prior Publication Data

US 2006/0064656 A1 Mar. 23, 2006

(51) Int. Cl.
*G06F 17/50* (2006.01)
(52) U.S. Cl. .......................................... 716/5
(58) Field of Classification Search .............. 716/5
See application file for complete search history.

(56) References Cited

U.S. PATENT DOCUMENTS

| | | | | |
|---|---|---|---|---|
| 6,009,251 A * | 12/1999 | Ho et al. | .................. | 716/5 |
| 6,829,754 B1 * | 12/2004 | Yu et al. | .................. | 716/5 |
| 2004/0025126 A1 * | 2/2004 | Culler et al. | ............. | 716/5 |
| 2005/0055654 A1 * | 3/2005 | Lin et al. | .................. | 716/5 |
| 2005/0097488 A1 * | 5/2005 | Lakshmanan et al. | ..... | 716/7 |
| 2005/0108666 A1 * | 5/2005 | Chang et al. | ............. | 716/2 |
| 2005/0125754 A1 * | 6/2005 | Schubert et al. | .......... | 716/5 |

* cited by examiner

*Primary Examiner*—Stacy A. Whitmore
(74) *Attorney, Agent, or Firm*—Eric James Whitesell

(57) ABSTRACT

A method and computer program product for early physical design validation and identification of texted metal short circuits in an integrated circuit design includes steps of: (a) receiving as input a representation of an integrated circuit design; (b) receiving as input a physical design rule deck that specifies rule checks to be performed on the integrated circuit design; (c) generating a specific rule deck from the physical design rule deck wherein the specific rule deck includes only physical design rules that are specific to one of identifying texted metal short circuits in the integrated circuit design and power distribution and input/output cell placement in the integrated circuit design; and (d) performing a physical design validation on the integrated circuit design from the specific rule deck.

12 Claims, 3 Drawing Sheets

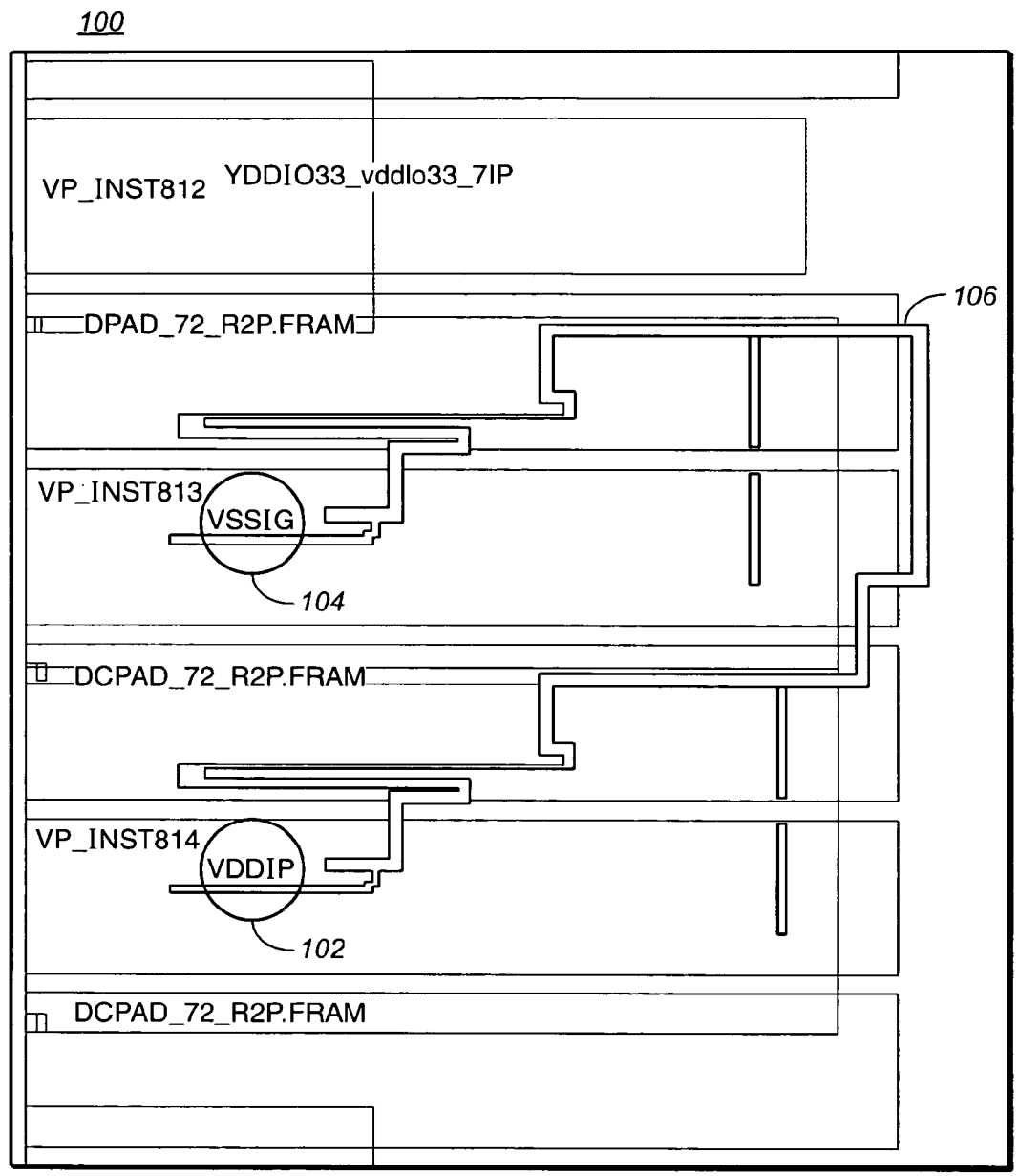
FIG._1

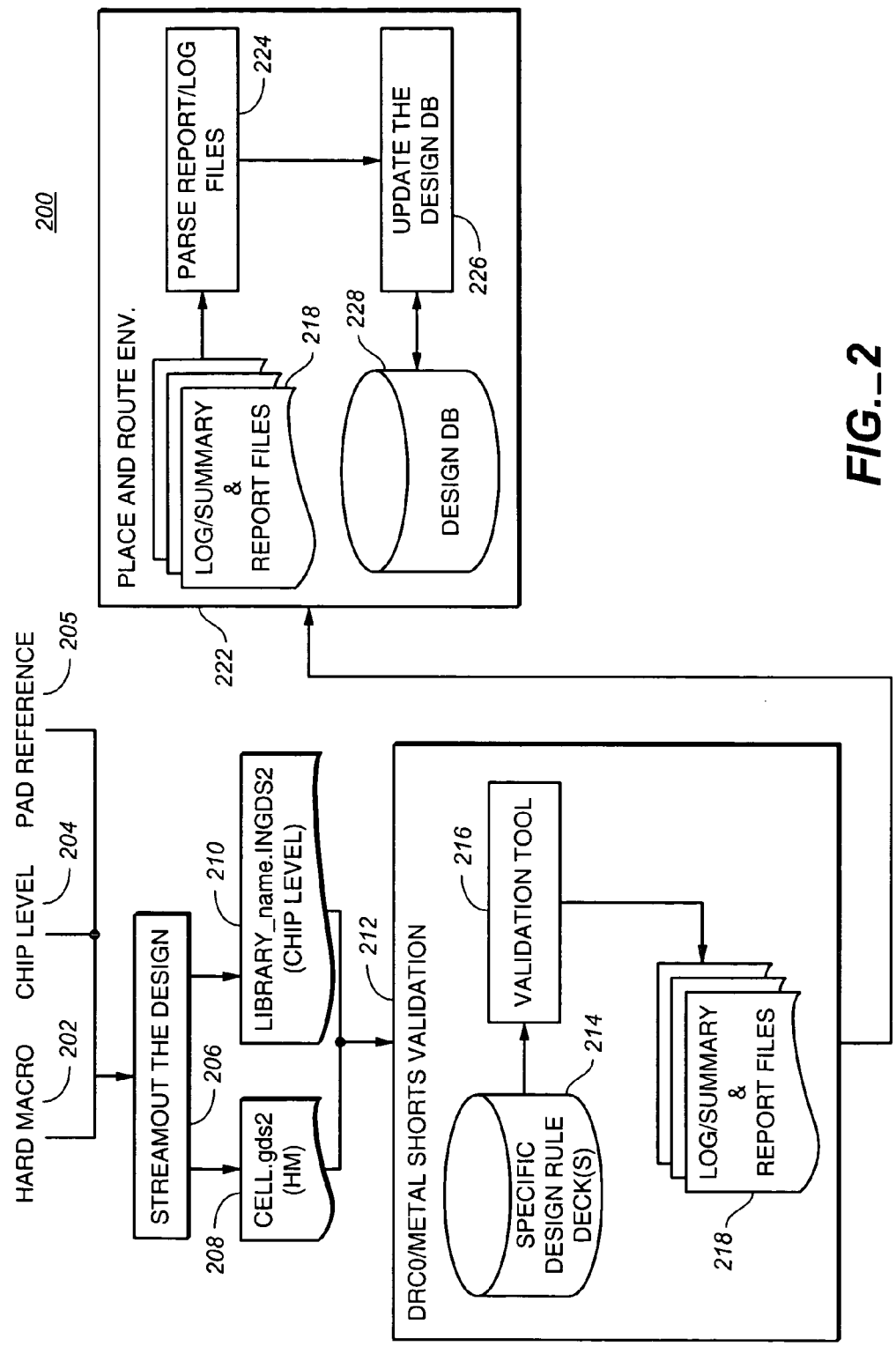
FIG._2

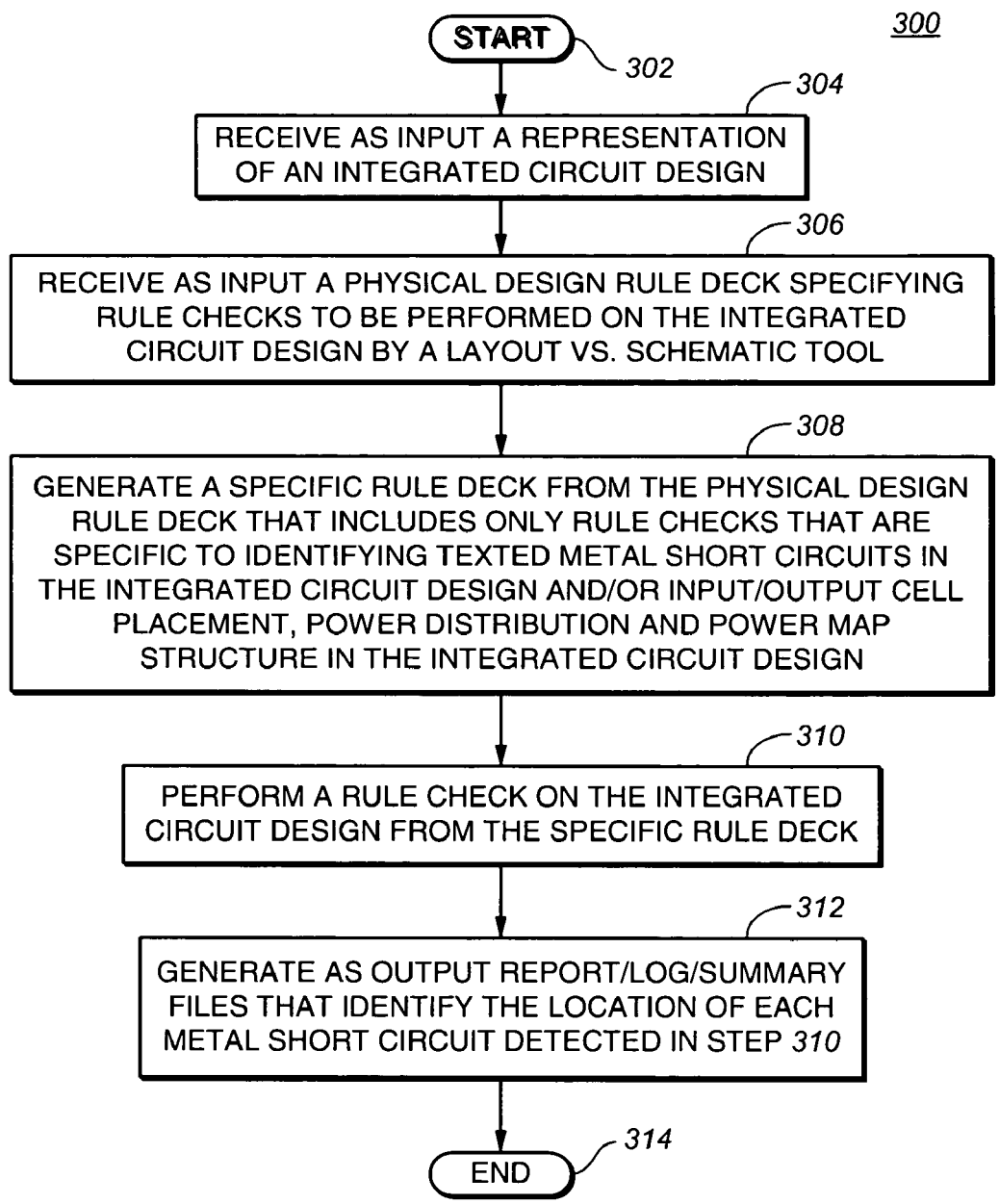
FIG._3

METHOD OF EARLY PHYSICAL DESIGN VALIDATION AND IDENTIFICATION OF TEXTED METAL SHORT CIRCUITS IN AN INTEGRATED CIRCUIT DESIGN

BACKGROUND OF THE INVENTION

1. Field of the Invention

The present invention relates generally to the design of integrated circuits. More specifically, but without limitation thereto, the present invention relates to methods of verifying an integrated circuit design to ensure adherence to process rules and overall manufacturability of the integrated circuit design for a specific technology.

2. Description of Related Art

Physical design validation of an integrated circuit design is an important aspect of the overall design flow. The physical design verification step ensures that the design of the integrated circuit die complies to all process rules and that any additional required steps specific to manufacturability for a selected technology have been performed, for example, metal utilization.

SUMMARY OF THE INVENTION

In one aspect of the present invention, a method of early physical design validation and identification of texted metal short circuits in an integrated circuit design includes steps of:

(a) receiving as input a representation of an integrated circuit design;

(b) receiving as input a physical design rule deck that specifies rule checks to be performed on the integrated circuit design;

(c) generating a specific rule deck from the physical design rule deck wherein the specific rule deck includes only physical design rules that are specific to one of identifying texted metal short circuits in the integrated circuit design and power distribution and input/output cell placement in the integrated circuit design; and (d) performing a physical design validation on the integrated circuit design from the specific rule deck.

In another aspect of the present invention, a computer program product for early physical design validation and identification of texted metal short circuits in an integrated circuit design includes:

a medium for embodying a computer program for input to a computer; and a computer program embodied in the medium for causing the computer to perform steps of:

(a) receiving as input a representation of an integrated circuit design;

(b) receiving as input a physical design rule deck that specifies rule checks to be performed on the integrated circuit design;

(c) generating a specific rule deck from the physical design rule deck wherein the specific rule deck includes only physical design rules that are specific to one of identifying texted metal short circuits in the integrated circuit design and power distribution and input/output cell placement in the integrated circuit design; and (d) performing a physical design validation on the integrated circuit design from the specific rule deck.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a computer display of a texted metal short circuit identified by a layout vs. schematic tool according to the prior art;

FIG. 2 illustrates a computer software diagram of early physical design validation and identification of texted metal short circuits in an integrated circuit design according to an embodiment of the present invention; and FIG. 3 illustrates a flow chart of a method of early physical design validation and identification of texted metal short circuits in an integrated circuit design according to an embodiment of the present invention.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

The physical design validation of an integrated circuit design ensures that all spatial constraints are satisfied for the traces and devices formed in various layers of an integrated circuit die. The structures formed in the several layers of an integrated circuit die are typically represented in a GDS2 (Generic Data Stream) format file that contains the chip topological information for creating the masks used in manufacturing the integrated circuit dies. The GDS2 format is an industry standard used by commercially available physical verification tools to represent physical design data.

Physical design validation is typically performed at the very end of the design cycle, that is, when all components of the integrated circuit design have been placed and routed. A problem with placing the physical design validation step at the end of the design flow is that a design fault detected so late might reset the time schedule for the entire integrated circuit design, depending on the severity of the problem. The design may have to be re-floorplanned, and the entire design cycle may have to be reiterated.

To avoid the disadvantages of late detection of design defects, a physical validation tool may be run on the GDS2 file during the early evolution of the design instead of at the end of the design cycle. Unfortunately, performing an early physical design validation with an entire set of process design rules for a specific technology would require a substantial amount of computer processing time that would severely impact the product turnaround time. Also, a large number of design errors would be falsely reported as design rule violations due to the incomplete circuit design, making it difficult to sort out the design errors that need to be corrected before the circuit design is completed.

Examples of a physical validation tool are a design rule check (DRC) tool and a layout vs. schematic (LVS) tool. A commercially available physical validation tool that includes a design rule check tool and a layout vs. schematic tool is the Calibre tool, which is available from Mentor Graphics Corporation. The method of the present invention provides design rules that may be used in conjunction with a design rule check tool and/or a layout vs. schematic tool in an early stage of the physical design to detect design rule violations in floorplanning, including input/output cell placement and construction and power distribution and power map structure. Also, texted metal short circuits may be identified most advantageously in the early or evolutionary aspects of the design flow, however, the identification of texted metal short circuits may be used at any point in the physical design validation flow. For example, texted metal short circuits may be identified in the power map in the early aspects of the design flow, advantageously reducing the computer processing time required to validate an integrated circuit design. The power map is created early in the design flow and should be consistent throughout the evolution of the design. Otherwise, there may be components in the integrated circuit design that are not connected to power and ground, or severe voltage droop may occur at some components in the integrated circuit design, and so on. If the power map is not validated early in the design flow, design defects may result in costly schedule delays and unacceptable turnaround time.

Previous methods of physical design validation do not check the physical design in the early stages of the design flow only from the perspective of metal short circuits or a limited subset of the process design rules for example, to ensure metal utilization compliance within the input/output cells and metal spacing and width constraints. However, a typical integrated circuit design may have a large amount of routing information created automatically and by manual entry, which greatly increases the likelihood of design rule violations such as a metal short circuit in the design. A metal short circuit is simply a metal connection between two different signal or power sources. An important example of a problematic metal short circuit is one between the supply voltage (VDD) and ground (VSS).

A typical layout vs. schematic tool uses several input files that are used in conjunction with a rule deck to detect design rule violations. One such file is the pad reference file. The pad reference file is used to associate a signal source location with a text name, for example:

| TEXT "VDD: P" | −4663.23 | 1918.53 | 96 |
| TEXT "VSS: G" | −4663.23 | 1836.53 | 96 |

The layout vs. schematic tool places the text signal names from the pad reference file, in this example, VDD and VSS, on the chip at the corresponding numerical XYZ coordinates associated with the text signal names. The coordinates are located on the bond site of each I/O pad cell in the chip. The layout vs. schematic tool traverses the GDS2 design file to ensure that there are no conflicting text entries on the net being traversed. For example, if a net has been texted, that is, named, with the text entry "CLK", then the rest of the net is traversed to ensure that there are no conflicting text entries on the net being traversed. A piece of metal in the chip that connects two different signal sources results in a "texted" metal short circuit.

Identifying texted metal short circuits in the physical design is a universal approach adopted in the industry to validate the physical design of an integrated circuit from a layout vs. schematic perspective. However, previous methods of physical design validation include design rules for detecting texted metal short circuits with all the other physical design rules used to validate the entire integrated circuit design, resulting in a less than optimum turnaround time for the integrated circuit design flow.

FIG. 1 illustrates a computer display 100 of a texted metal short circuit identified by a layout vs. schematic tool according to the prior art. Shown in the computer display 100 are text signal names 102 and 104 and a highlighted path 106.

In FIG. 1, the computer display 100 shows the text signal names 102 (VDD:P) and 104 (VSS:G) and the highlighted path 106 that connects them. The metal short circuit may be anywhere along the highlighted path 106. The exact location of the metal short circuit is typically included in a report file generated by the layout vs. schematic tool. Because the layout vs. schematic tool is typically not employed until near the end of the design cycle, texted metal short circuits may not be detected until late in the design after a large amount of computer time has already been invested.

The method of the present invention exploits the capability of the layout vs. schematic tool to detect metal short circuits by reducing the standard design rule deck used for physical design validation to include only those design rules needed to detect texted metal short circuits. The physical design validation step is then performed on the reduced rule deck early in the integrated circuit design cycle.

In one aspect of the present invention, a method includes steps of:
  (a) receiving as input a representation of an integrated circuit design;
  (b) receiving as input a physical design rule deck that specifies rule checks to be performed on the integrated circuit design;
  (c) generating a specific rule deck from the physical design rule deck wherein the specific rule deck includes only physical design rules that are specific to one of identifying texted metal short circuits in the integrated circuit design and power distribution and input/output cell placement in the integrated circuit design; and
  (d) performing a physical design validation on the integrated circuit design from the specific rule deck.

FIG. 2 illustrates a computer software diagram 200 of a method of early physical design validation and detection of texted metal short circuits according to an embodiment of the present invention. Shown in FIG. 2 are a hard macro file 202, a chip level file 204, a pad reference file 205, a stream-out tool 206, a hard macro cell GDS2 description file 208, a chip level cell GDS2 description file 210, an early design rule check and texted metal short circuit verification environment 212, a specific rule deck 214, a validation tool 216, report/summary/log files 218, a place and route environment 222, a report file parser 224, a design database update tool 226, and a design database 228.

The hard macro file 202, the chip level file 204, and the pad reference file 205 are generated by a circuit designer according to well known integrated circuit design techniques.

The stream-out tool 206 generates the hard macro cell GDS2 description file 208 and the chip level cell GDS2 description file 210 according to well known techniques from the hard macro file 202 and the chip level file 204. The GDS2 description files 208 and 210 define the structures formed in the several layers of an integrated circuit die in a format that contains the chip topological information used for creating the masks used in manufacturing the integrated circuit dies.

The early design rule check and texted metal short circuit verification environment 212 includes the specific rule deck 214, the validation tool 216, and the report/summary/log files 218. The specific deck 214 is an important feature of the present invention, because the specific rule deck 214 includes only rules that are specific to the detection of texted metal short circuits and/or rules that are specific to, for example, metal utilization within the input/output cells, power map metal spacing and width constraints associated with the metal layers used in the power map, via structures in the integrated circuit design, and metal slots used in the integrated circuit design. The reduced number of design rules used in the specific rule deck 214 compared to a general design rule deck advantageously reduces the run time required to perform a physical design validation on the integrated circuit design, and can detect design errors that may be corrected before investing the time required to generate and validate the entire integrated circuit design. The specific rule deck may be a separate rule deck that only includes rules that are specific to the detection of texted metal short circuits, or the specific rule deck may be a separate rule deck that includes only rule violations that are specific to an early design rule check (DRC0), for example, metal utilization within the input/output cells, power map metal spacing and width constraints associated with the metal layers used in the power map, via structures in the integrated circuit design, and metal slots used in the integrated circuit design. The specific rule deck may also be a combination of the separate rule decks.

Examples of design rules for inclusion in the specific rule deck that are specific to the early detection of design rule violations for a selected integrated circuit manufacturing technology include but are not limited to:

(1) cells not connected to power (VDD);
(2) cells not connected to ground (VSS);
(3) power and ground paths closer to each other than a minimum allowed spacing;
(4) via/contact spacing less than a minimum allowed spacing;
(5) via/contact size less than a minimum metal size;
(6) wide power buses that do not have the correct number of slots;
(7) metal layer width, spacing and hole dimensions not within allowed range; and
(8) I/O and core regions of the chip exceed maximum allowed limits for the selected technology.

The specific rule deck 214 may be, for example, a text file that implements the various rule requirements in a rule format such as the Standard Verification Rule Format (SVRF) commonly used by commercially available physical design validation tools.

The validation tool 216 may be, for example, a design rule check (DRC) tool and/or a layout vs. schematic (LVS) tool. An exemplary validation tool is Calibre, a commercially available software program from Mentor Graphics Corporation that validates the adherence of the integrated circuit design to the rules specified in the design rule deck.

The report/summary/log files 218 are generated by the validation tool 216 and include a summary of the design rule checks performed on the integrated circuit design and the number of violations detected for each of the design rules. The report/summary/log files 218 also provide the precise locations of each of the texted metal short circuits detected in the integrated circuit design so that the circuit designer can readily correct design defects in an efficient manner.

The report file parser 224 parses the report/summary/log files 218 according to well known techniques to provide the circuit designer with the information needed to correct the rule violations.

The design database update tool 226 may be, for example, a commercially available software tool used to update the design database 228 with the corrections to the integrated design.

FIG. 3 illustrates a flow chart 300 of a method of early physical design validation and identification of texted metal short circuits in an integrated circuit design according to an embodiment of the present invention.

Step 302 is the entry point of the flow chart 600.

In step 304, a representation of an integrated circuit design is received as input. In this example, the representation is a GDS2 design database, however, other formats for representing a circuit design may also be used to practice the present invention within the scope of the appended claims.

In step 306, a physical design rule deck is received as input specifying rule checks to be performed on the entire integrated circuit design by a layout vs. schematic tool.

In step 308, a specific rule deck is generated from the physical design rule deck that includes only rule checks that are specific to identifying texted metal short circuits in the integrated circuit design and/or input/output cell placement, power distribution and power map structure in the integrated circuit design. Alternatively, the specific rule deck may be generated directly as described above in Standard Verification Rule Format (SVRF).

In step 310, a physical design validation is performed on the integrated circuit design from the specific rule deck to identify rule violations in the integrated circuit design. The physical design validation may be performed according to well known techniques, for example, by a design rule check tool and/or a layout vs. schematic tool.

In step 312, report/summary/log files are generated as output that include the precise location of each texted metal short circuit identified in step 310. The circuit designer may then make the appropriate corrections to the integrated circuit design database.

Step 314 is the exit point of the flow chart 300.

As may be appreciated from the above, the method of the present invention provides a flexible and robust architecture that can accommodate both in-house and third-party physical design validation tools and can work with a wide variety of computer resources.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

The steps described above with regard to the flow chart described above may also be implemented by instructions performed on a computer according to well-known computer programming techniques.

In another aspect of the present invention, a computer program product includes:

a medium for embodying a computer program for input to a computer; and a computer program embodied in the medium for causing the computer to perform steps of:

(a) receiving as input a representation of an integrated circuit design;

(b) receiving as input a physical design rule deck that specifies rule checks to be performed on the integrated circuit design;

(c) generating a specific rule deck from the physical design rule deck wherein the specific rule deck includes only physical design rules that are specific to one of identifying texted metal short circuits in the integrated circuit design and power distribution and input/output cell placement in the integrated circuit design; and (d) performing a physical design validation on the integrated circuit design from the specific rule deck.

While the invention herein disclosed has been described by means of specific embodiments and applications thereof, numerous modifications and variations could be made thereto by those skilled in the art without departing from the scope of the invention set forth in the following claims.

What is claimed is:

1. A method comprising steps of:
   (a) receiving as input a representation of an integrated circuit design;
   (b) receiving as input a physical design rule deck that specifies rule checks to be performed on the integrated circuit design;
   (c) generating a specific rule deck from the physical design rule deck wherein the specific rule deck includes only physical design rules that are specific to texted metal short circuits between different signal sources in addition to power and ground in the integrated circuit design; and
   (d) performing a physical design validation on the integrated circuit design from the specific rule deck to identify texted metal short circuits between different signal sources in addition to power and ground in the integrated circuit design.

2. The method of claim 1 further comprising performing step (d) prior to performing a physical design validation that includes a design rule that is not included in the specific rule deck.

3. The method of claim 1 further comprising a step of including in the specific rule deck a rule check for at least one of:
   via/contact spacing less than a minimum allowed spacing;
   via/contact size less than a minimum metal size;
   wide power buses that do not have the correct number of slots;
   metal layer width, spacing and hole dimensions not within allowed range; and
   input/output cell and core cell regions of the chip exceed maximum allowed limits for a selected technology.

4. The method of claim 1 further comprising a step of generating as output a report file that includes a location of each texted metal short circuit identified in step (d).

5. The method of claim 1 wherein the representation of the integrated circuit design is a Generic Data Stream format file.

6. The method of claim 1 wherein the physical design validation is performed by one of a design rule check tool and a layout vs. schematic tool.

7. A computer program product comprising:
   a medium for embodying a computer program for input to a computer; and
   a computer program embodied in the medium for causing the computer to perform steps of:
   (a) receiving as input a representation of an integrated circuit design;
   (b) receiving as input a physical design rule deck that specifies rule checks to be performed on the integrated circuit design;
   (c) generating a specific rule deck from the physical design rule deck to include only physical design rules that are specific to texted metal short circuits between different signal sources in addition to power and ground in the integrated circuit design; and
   (d) performing a physical design validation on the integrated circuit design from the specific rule deck to identify texted metal short circuits between different signal sources in addition to power and ground in the integrated circuit design.

8. The computer program product of claim 7 further comprising performing step (d) prior to performing a physical design validation that includes a design rule that is not included in the specific rule deck.

9. The computer program product of claim 7 further comprising a step of including in the specific rule deck a rule check for at least one of:
   via/contact spacing less than a minimum allowed spacing;
   via/contact size less than a minimum metal size;
   wide power buses that do not have the correct number of slots;
   metal layer width, spacing and hole dimensions not within allowed range; and
   input/output cell and core cell regions of the chip exceed maximum allowed limits for a selected technology.

10. The computer program product of claim 7 farther comprising a step of generating as output a report file that includes a location of each texted metal short circuit identified in step (d).

11. The computer program product of claim 7 wherein the representation of the integrated circuit design is a Generic Data Stream format file.

12. The computer program product of claim 7 wherein the physical design validation is performed by one of a design rule check tool and a layout vs. schematic tool.

\* \* \* \* \*